(12) United States Patent
Itoh

(10) Patent No.: US 6,677,795 B2
(45) Date of Patent: Jan. 13, 2004

(54) FLIP-FLOP CIRCUIT

(75) Inventor: Takaharu Itoh, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/210,748

(22) Filed: Jul. 31, 2002

(65) Prior Publication Data
US 2003/0025543 A1 Feb. 6, 2003

(30) Foreign Application Priority Data
Aug. 2, 2001 (JP) .................................. 2001-234459

(51) Int. Cl.[7] .................. H03K 3/289; H03K 3/356
(52) U.S. Cl. .................................. 327/202; 327/203
(58) Field of Search ............................ 327/199, 200, 327/201, 202, 203, 208–212, 218

(56) References Cited

U.S. PATENT DOCUMENTS 4,843,254 A * 6/1989 Motegi et al. ............. 327/203
6,008,678 A * 12/1999 Barber ....................... 327/203
6,242,957 B1 * 6/2001 Uemura ..................... 327/202

* cited by examiner

*Primary Examiner*—Tuan T. Lam
(74) *Attorney, Agent, or Firm*—Darryl G. Walker; Bradley T. Sako

(57) ABSTRACT

A flip-flop circuit (100) that may have a reduced delay time between an edge of a clock input signal and a data output signal has been disclosed. A data signal may be received at a data input terminal (1), a clock input signal may be received at a clock signal input terminal (2), and data may be provided at a data output terminal (3). Data may be transferred from a master latch to a slave latch through a transfer circuit in response to an edge of a clock input signal. A transfer circuit may include a transfer device (6) which may have a control terminal connected to a clock signal input terminal (2) and a transfer device (5) which may have a control terminal connected to a buffered clock signal (C). In this way, delay time may be reduced while maintaining high-speed operations even if an input clock signal has a rounded or distorted waveform.

20 Claims, 7 Drawing Sheets

FLIP-FLOP CIRCUIT

TECHNICAL FIELD

The present invention relates generally a flip-flop circuit and more particularly to a flip-flop circuit of a master slave system that may have a reduced signal propagation delay period from switching a clock signal to providing an output signal so that high-speed operation may be improved.

BACKGROUND OF THE INVENTION

Recently, the operating frequency of even a CMOS (complementary metal oxide semiconductor) circuit can be required to be in the order of a GHz. In order to satisfy such a high frequency requirement, it has been necessary to improve the operating speed of a flip-flop circuit.

Referring now to FIG. 9, a circuit schematic diagram of a conventional flip-flop circuit is set forth and given the general reference character 900.

Conventional flip-flop circuit 900 has a data input terminal 70, a clock signal input terminal 71 and a data output terminal 72. Conventional flip-flop circuit 900 includes clocked inverters (75, 76, and 77), inverters (78, 79, 80, 81, 82, and 83), a p-channel data transfer gate 73, and an n-channel data transfer gate 74.

Data input terminal 70 is connected to an input of a clocked inverter 75. Clocked inverter 75 has an output connected to an input terminal of inverter 78. Inverter 78 has an output terminal connected to an input terminal of clocked inverter 76 and an input terminal of inverter 79. Clocked inverter 76 has an output terminal connected to an input terminal of inverter 78. Inverter 78 and clocked inverter 76 form a latch. Inverter 81 receives a clock signal at a clock signal input terminal 71 and provides an inverted clock signal CB as an input to inverter 82. Inverter 82 provides a normal clock signal C.

Clocked inverter 75 receives the normal clock signal C at an inverted input terminal and inverted clock signal CB at a normal input terminal. Clocked inverter 76 receives the normal clock signal C at a normal input terminal and inverted clock signal CB at an inverted input terminal.

P-channel data transfer gate 73 has a source/drain terminal connected to an output of inverter 79, another source/drain terminal connected to inputs of inverters (80 and 83), and a control gate connected to receive inverted clock signal CB. N-channel data transfer gate 74 has a source/drain terminal connected to an output of inverter 79, another source/drain terminal connected to inputs of inverters (80 and 83), and a control gate connected to receive normal clock signal C.

Inverter 80 has a output connected to an input of clocked inverter 77. Clocked inverter 77 has an output connected to inputs of inverters (80 and 83). Inverter 80 and clocked inverter 77 form a latch. Clocked inverter 77 receives inverted clock signal CB at a normal input terminal and normal clock signal C at an inverted input terminal.

Inverter 83 has an output connected to data output terminal 72.

In conventional flip-flop circuit 900, data from data input terminal 70 is latched in a latch (master latch) formed by inverter 78 and clocked inverter 76 by the rising edge of a clock signal received at clock signal input terminal 71. At this time, p-channel data transfer gate 73 and n-channel data transfer gate 74 are also turned on (open) by the rising edge of a clock signal received at clock signal input terminal 71. This data is then output at the data output terminal 72 by inverter 83. Based on the falling edge of a clock signal received at clock signal input terminal 71, p-channel data transfer gate 73 and n-channel data transfer gate 74 are also turned off (closed). At this time, clocked inverter 77 is enabled and the data is latched in the latch (slave latch) formed by inverter 80 and clocked inverter 77.

Referring now to FIG. 10, a circuit schematic diagram of a flip-flop circuit is set forth and given the general reference character 1000. Flip-Flop 1000 is proposed to eliminate or reduce a delay of inverters (81 and 82).

Flip-flop circuit 1000 includes the same constituents as conventional flip-flop circuit 900. These same constituents are referred to by the same reference characters.

Flip-flop circuit 1000 differs from conventional flip-flop circuit 900 in that n-channel data transfer gate 74 has a control gate connected directly to the clock signal input terminal 71. By doing so, a delay from the rising edge of a clock signal provided to clock signal input terminal 71 to data being output at data output terminal 72 can be improved by eliminating a delay of inverters (81 and 82) before turning on n-channel data transfer gate 74. Otherwise, the structure of flip-flop circuit 1000 is identical to conventional flip-flop circuit 900.

In conventional flip-flop circuit 900, a timing at which n-channel data transfer gate 74 opens (is turned on) is delayed by a delay (T1+T2 as illustrated in FIG. 2 which will be described later). The delay (T1+T2) corresponds to the propagation delay of inverters (81 and 82). This causes a delay in the change of data at data output terminal 72 with respect to a rising edge of a clock signal input at clock signal input terminal 71.

In flip-flop circuit 1000, a delay can be improved as compared to a delay in conventional flip-flop circuit 900 if a clock signal provided at clock signal input terminal 71 is ideal. However, the clock signal is typically rounded due to capacitance caused by, for example, wire routing or gate loads. The affect of the rounding of the clock signal waveform is illustrated in FIGS. 4 and 5. FIG. 4 is a graph illustrating a relationship between rounding of rising edge of a clock signal waveform and a delay time of data switching from a high to a low logic level at an output of transfer gates. FIG. 5 is a graph illustrating a relationship between rounding of a rising edge of a clock signal waveform and a delay time of data switching from a high to a low logic level at an output of transfer gates. Although the details will be described later, when the waveform of the rising edge of the clock signal waveform is rounded by less than about 1 nanosecond, the delay time in flip-flop circuit 1000 for data switching from a high to a low logic level is less than the delay time in conventional flip-flop circuit 900. However, when the waveform of the rising edge of the clock signal waveform is rounded by more than about 1 nanosecond, the delay time in flip-flop circuit 1000 for data switching from a high to a low logic level is more than the delay time in conventional flip-flop circuit 900.

In this way, if the clock signal is provided directly to n-channel transfer gate 74 as in flip-flop circuit 1000, the delay time improvements deteriorate as the clock signal waveform is rounded. Thus, a speed improvement may only be realized if the clock signal waveform is near ideal. However, a clock signal may be heavily loaded and an ideal waveform may not be feasible.

In view of the above discussion, it would be desirable to provide a flip-flop circuit that may reduce a delay from an edge of a clock signal to an output of a data signal. It would also be desirable to provide a flip-flop circuit where the delay may be reduced even if a clock signal waveform is rounded. In this way, high-speed operations may be improved.

SUMMARY OF THE INVENTION

According to the present embodiments, a flip-flop circuit that may have a reduced delay time between an edge of a clock input signal and a data output signal is disclosed. A data signal may be received at a data input terminal, a clock input signal may be received at a clock signal input terminal, and data may be provided at a data output terminal. Data may be transferred from a master latch to a slave latch through a transfer circuit in response to an edge of a clock input signal. A transfer circuit may include a transfer device which may have a control terminal connected to a clock signal input terminal and a transfer device which may have a control terminal connected to a buffered clock signal. In this way, delay time may be reduced while maintaining high-speed operations even if an input clock signal has a rounded or distorted waveform.

According to one aspect of the embodiments, a flip-flop circuit may include a master flip-flop, a slave flip-flop, a data transfer circuit, a first inverter, and a second inverter. The master flip-flop may receive a data input and the slave flip-flop may provide a data output. A data transfer circuit may provide a data path between the master flip-flop and the slave flip-flop. The first inverter may receive a clock signal and provide an inverted clock signal. The second inverter may receive the inverted clock signal and provide a normal clock signal. The data transfer circuit may include a first transfer gate, a second transfer gate, and a third transfer gate. The first transfer gate and the second transfer gate may have a first conductivity type and the third transfer gate may have a second conductivity type. The first, second, and third transfer gates may respectively provide first, second, and third controllable impedance paths between the master flip-flop and the slave flip-flop. The first transfer gate may have a first control terminal connected to receive the clock signal. The second transfer gate may have a second control terminal connected to receive the normal clock signal. The third transfer gate may have a third control terminal connected to receive the inverted clock signal.

According to another aspect of the embodiments, the first conductivity type may be a n-type and the second conductivity type may be a p-type. The first, second, and third transfer gates may be insulated gate field effect transistors (IGFETs).

According to another aspect of the embodiments, the master flip-flop may include a first master flip-flop inverter and a second master flip-flop inverter arranged to form a flip-flop. The slave flip-flop may include a first slave flip-flop inverter and a second slave flip-flop inverter arranged to form a flip-flop.

According to another aspect of the embodiments, the second master flip-flop inverter and the second slave flip-flop inverter may be clocked inverters.

According to another aspect of the embodiments, the first conductivity type may be a p-type and the second conductivity type may be a n-type. The first, second, and third transfer gates may be insulated gate field effect transistors (IGFETs).

According to another aspect of the embodiments, the first, second, and third transfer gates may be IGFETs and the first transfer gate may have a gate width that is less than or equal to a gate width of the second transfer gate.

According to another aspect of the embodiments, a flip-flop circuit may include a master flip-flop, a slave flip-flop, a data transfer circuit, a first inverter, and a second inverter. The master flip-flop may receive a data input and the slave flip-flop may provide a data output. A data transfer circuit may provide a data path between the master flip-flop and the slave flip-flop. The first inverter may receive a clock signal and provide an inverted clock signal. The second inverter may receive the inverted clock signal and provide a normal clock signal. The data transfer circuit may include a first transfer gate, a second transfer gate, and a third transfer gate. The first transfer gate and the second transfer gate may have a first conductivity type and the third transfer gate may have a second conductivity type. The first and second transfer gates may respectively provide first and second controllable impedance paths between a first reference potential and an input of the slave flip-flop. The third transfer gate may provide a third controllable impedance path between a second reference potential and the input of the slave-flip-flop. The first transfer gate may have a first control terminal connected to receive the clock signal. The second transfer gate may have a second control terminal connected to receive the normal clock signal. The third transfer gate may have a third control terminal connected to receive the inverted clock signal.

According to another aspect of the embodiments, the first conductivity type may be a n-type and the second conductivity type may be a p-type. The first, second, and third transfer gates may be insulated gate field effect transistors (IGFETs). The first reference potential may be lower than the second reference potential.

According to another aspect of the embodiments, the first conductivity type may be a p-type and the second conductivity type may be a n-type. The first, second, and third transfer gates may be insulated gate field effect transistors (IGFETs). The first reference potential may be higher than the second reference potential.

According to another aspect of the embodiments, the data transfer circuit may include a fifth transfer gate of the first conductivity type and a sixth transfer gate of the second conductivity type. The fifth and sixth transfer gates may be coupled to receive an output from the master flip-flop at control terminals and may provide a logical inversion when the first, second, and third transfer gates are enabled.

According to another aspect of the embodiments, a flip-flop circuit may include a first inverter, a second inverter, a first data latch, a second data latch, and a transfer circuit. The first inverter may receive a clock signal and provide an inverted clock signal. The second inverter may receive the inverted clock signal and provide a normal clock signal. The first data latch may receive input data and may latch an input data value when the clock signal has a first logic state. The second data latch may receive transfer data and latch a transfer data value when the clock signal has a second logic value. The transfer circuit may receive the input data value and may provide the transfer data when clock signal has the first logic state. The transfer circuit may include a first transfer insulated gate field effect transistor (IGFET) of a first conductivity type, a second IGFET of the first conductivity type, and a third IGFET of a second conductivity type. The first IGFET may have a first IGFET control terminal connected to receive the clock signal. The second IGFET may have a second IGFET control terminal coupled to receive the normal clock signal. The third IGFET may have a third IGFET control terminal coupled to receive the inverted clock signal.

According to another aspect of the embodiments, the first, second, and third IGFETs may have controllable impedance paths connected in parallel between the transfer circuit input and the transfer circuit output.

According to another aspect of the embodiments, the first conductivity type may be n-type and the second conductivity type may be p-type.

According to another aspect of the embodiments, the first conductivity type may be p-type and the second conductivity type may be n-type.

According to another aspect of the embodiments, the first and second IGFETs may have controllable impedance path connected in parallel between a first potential and the transfer circuit output. The third IGFET may have a controllable impedance path connected between a second potential and the transfer circuit output.

According to another aspect of the embodiments, the first conductivity type may be n-type and the second conductivity type may be p-type and the first potential may be a ground potential and the second potential may be a power supply potential.

According to another aspect of the embodiments, the first conductivity type may be p-type and the second conductivity type may be n-type and the first potential may be a power supply potential and the second potential may be a ground potential.

DETAILED DESCRIPTION OF THE EMBODIMENTS

Various embodiments of the present invention will now be described in detail with reference to a number of drawings.

Figure 1:
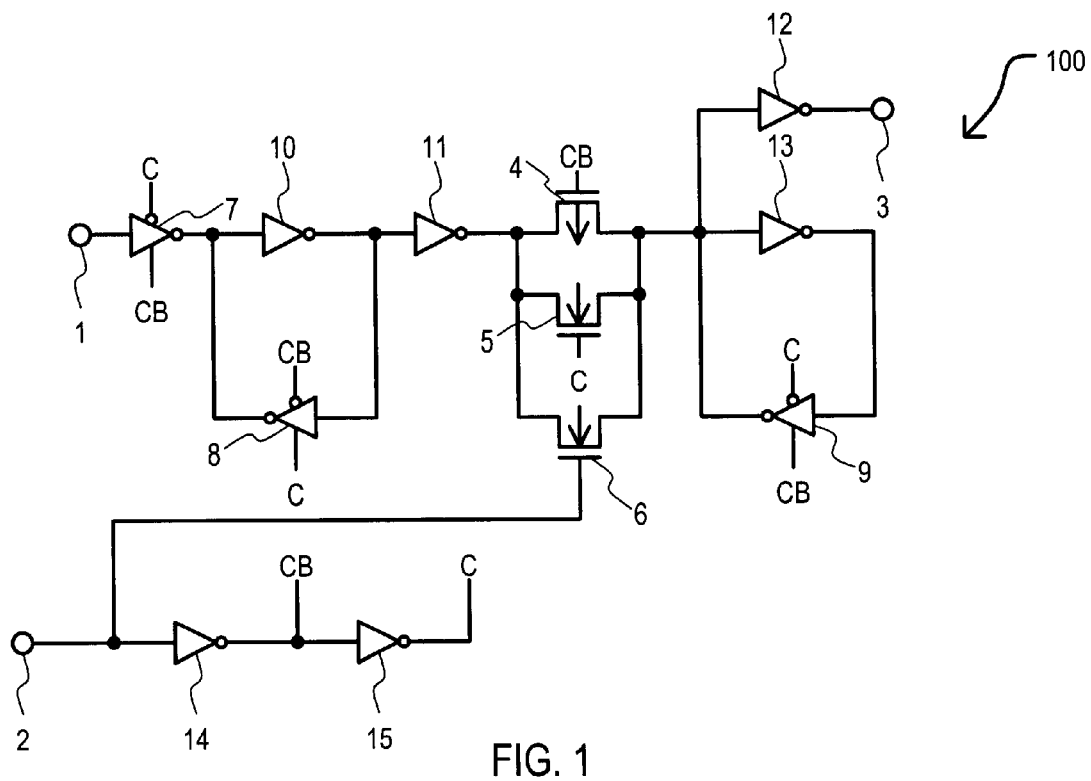
FIG. 1 is a circuit schematic diagram of flip-flop circuit according to an embodiment.

Referring now to FIG. 1, a circuit schematic diagram of flip-flop circuit according to an embodiment is set forth and given the general reference character 100. Flip-flop circuit 100 may be a master-slave type flip-flop, as just one example.

Flip-flop circuit 100 may receive a data input signal at a data input terminal 1, a clock signal at a clock signal input terminal 2 and provide an output signal at a data output terminal 3.

Flip-flop circuit 100 may include clocked inverters (7, 8, and 9), inverters (10, 11, 12, 13, 14, and 15), and transfer gates (4, 5, and 6). Clocked inverter 7 may have an input connected to data input terminal 1 and may have an output connected to an input of inverter 10. Inverter 10 may have an output connected to an input of inverter 11 and an input of clocked inverter 8. Clocked inverter 8 may have an output connected to an input of inverter 10. Transfer gates (4, 5, and 6) may each have a source/drain commonly connected to an output of inverter 11 and another source/drain commonly connected to an input of inverter 12 and an input of inverter 13. Transfer gate 4 may receive an inverted clock signal CB at a control terminal. Transfer gate 5 may receive a normal clock signal C at a control terminal. Transfer gate 6 may have a control terminal connected to clock signal input terminal 2. Inverter 12 may provide an output signal at data output terminal 3. Inverter 13 may have an output connected to an input of clocked inverter 9. Clocked inverter 9 may have an output connected to inputs of inverters (12 and 13). Inverter 14 may have an input connected to clock signal input terminal 2 and may provide inverted clock signal CB at an output. Inverter 15 may receive inverted clock signal CB at an input and may provide normal clock signal C at an output.

Clocked inverter 7 may receive inverted clock signal CB at an enable terminal and normal clock signal C at an inverted enable terminal. Clocked inverter 8 may receive normal clock signal C at an enable terminal and inverted clock signal CB at an inverted enable terminal. Clocked inverter 9 may receive inverted clock signal CB at an enable terminal and normal clock signal C at an inverted enable terminal.

Transfer gate 4 may be an insulated gate field effect transistor (IGFET) and more particularly may be a p-type metal oxide semiconductor field effect transistor (MOSFET), as just one example. Transfer gate 5 may be an IGFET and more particularly may be an n-type MOSFET, as just one example. Transfer gate 6 may be an IGFET and more particularly may be an n-type MOSFET, as just one example.

Inverter 10 and clocked inverter 8 may form a master flip-flop or latch. The master flip-flop or latch may be enabled in response to a rising edge of a clock signal provided at clock signal input terminal 2. In this way, data provided at data input terminal 1 at the rising edge of the clock signal may be held in the master flip-flop or latch.

Inverter 13 and clocked inverter 9 may form a slave flip-flop or latch. The slave flip-flop or latch may be enabled in response to a falling edge of a clock signal provided at clock signal input terminal 2. In this way, data stored in the master flip-flop or latch at the falling edge of the clock signal may be held in the slave flip-flop or latch.

Transfer gates (4, 5, and 6) may be turned on in response to a rising edge of a clock signal provided at clock signal input terminal 2 and may be turned off in response to a falling edge of a clock signal provided at clock signal input terminal 2.

In this way, data held in the master latch (master flip-flop) may be transferred to the input of inverter 12 through transfer gates (4, 5, and 6) in response to the rising edge of a clock signal provided at clock signal input terminal 2. This data may then be output to data output terminal 3 by inverter 12. Transfer gates (4, 5, and 6) may then be turned off in response to a falling edge of a clock signal provided at clock signal input terminal 2. At this time, the data may be held in the slave latch (slave flip-flop).

Figure 3:
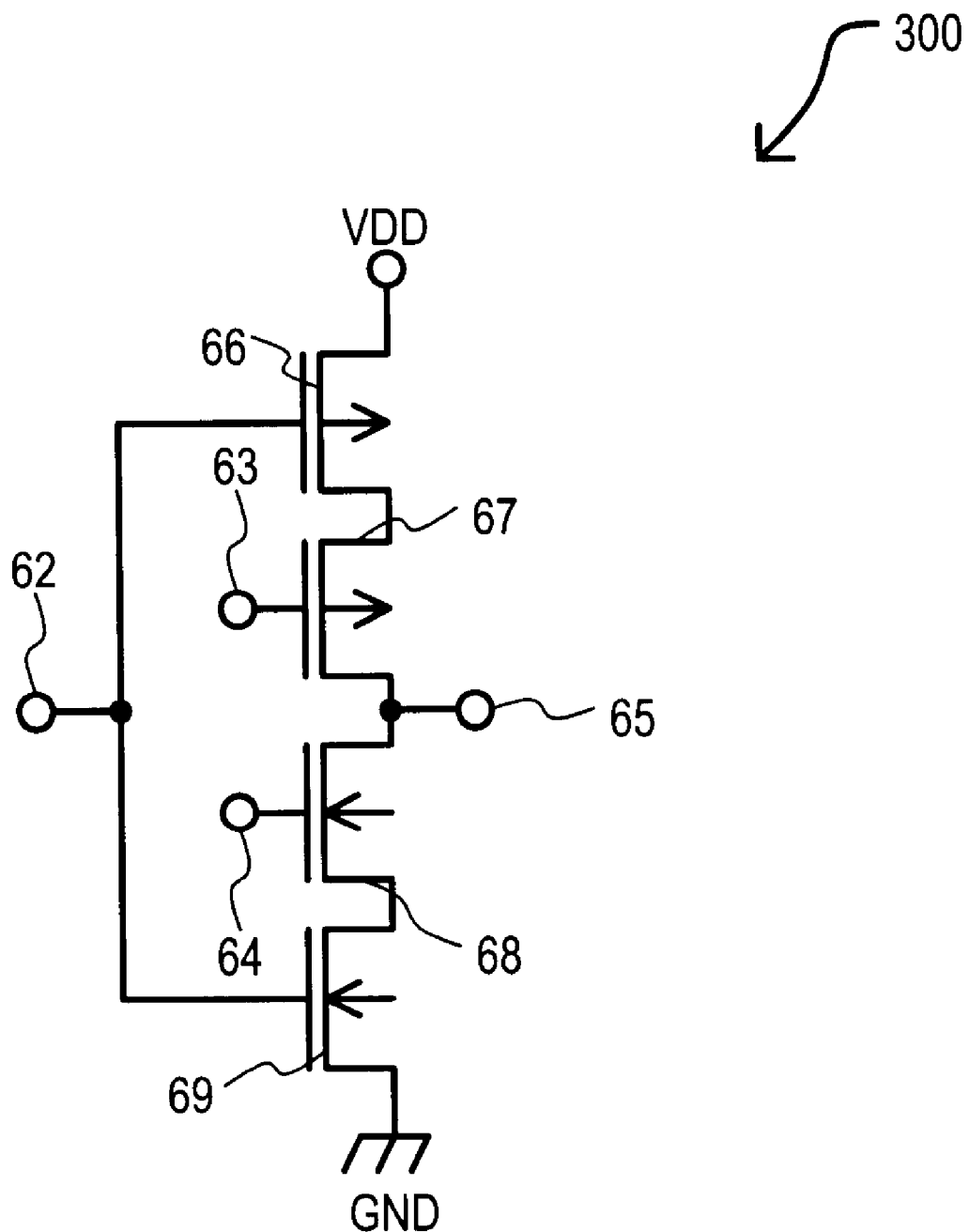
FIG. 3 is a circuit schematic diagram of a clocked inverter according to an embodiment.

Referring now to FIG. 3, a circuit schematic diagram of a clocked inverter according to an embodiment is set forth and given the general reference character 300.

Clocked inverter 300 may be used as clocked inverters (7, 8, and 9) in flip-flop circuit 100.

Clocked inverter 300 may receive inputs at a data input terminal 62, an inverted enable terminal 63, and an enable terminal 64 and may provide an output at a data output terminal 65. Clocked inverter 300 may include transistors (66, 67, 68, and 69). Transistor 66 may have a source connected to a power supply potential VDD, a drain connected to a source of transistor 67, and a gate connected to a data input terminal 62. Transistor 67 may have a drain connected to a drain of transistor 68 at a data output terminal 65 and a gate connected to an inverted enable terminal 63. Transistor 64 may have a source connected to a drain of transistor 69 and a gate connected to an enable terminal 64. Transistor 69 may have a source connected to a ground GND and a gate connected to data input terminal 62.

Transistors (66 and 67) may be p-type IGFETs and in particular may be p-type MOSFETs, as just one example. Transistors (68 and 69) may be n-type IGFETs and in particular may be n-type MOSFETs, as just one example.

Referring once again to FIG. 1, transfer gate 6 may have a gate width that may be equal to or smaller than a gate width of transfer gate 5. In this way, even if clock signal input terminal is connected directly to transfer gate 6 an increased capacitance at clock input terminal 2 may be reduced. For example, in a 0.15 μm process, the capacitance of clock input terminal 2 may be about 4.7 fF in the conventional approach, but may only be increased to about 5.1 fF in flip-flop circuit 100 of the present embodiment. Thus, flip-flop circuit 100 may have an increased capacitance at clock signal input terminal 2 of about 0.4 fF. However, high speed operation may still be improved even if an input clock signal has a waveform that is rounded, as will be described later.

Figure 2:
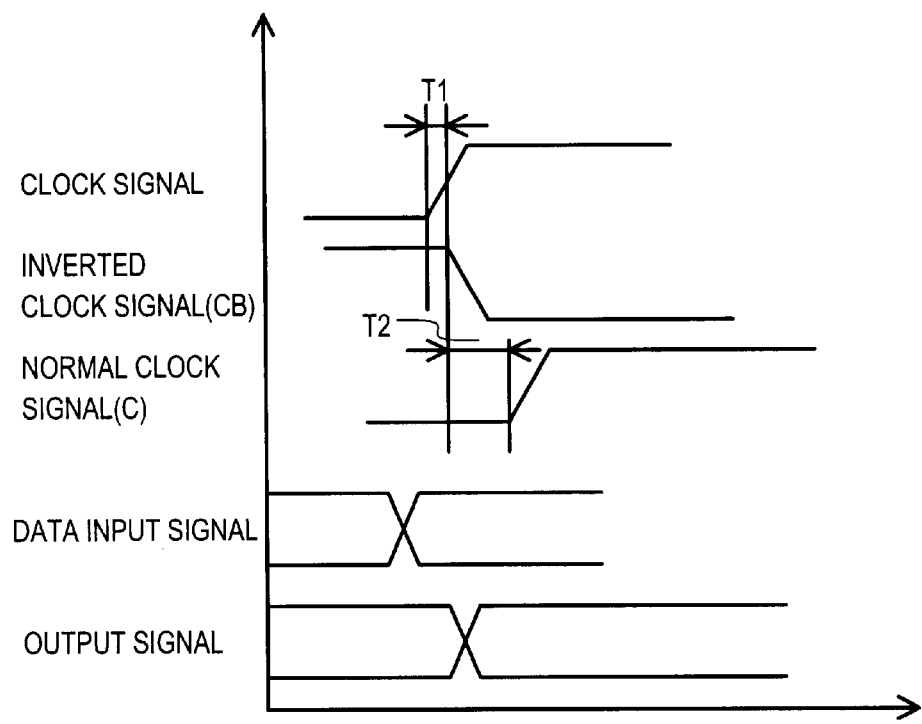
FIG. 2 is a timing diagram illustrating the operation of a flip-flop circuit according to an embodiment.

The operation of flip-flop circuit 100 will now be described by referring to FIG. 2 in conjunction with FIG. 1. FIG. 2 is a timing diagram illustrating the operation of flip-flop circuit 100 according to an embodiment.

The timing diagram of FIG. 2 may include a clock signal received at clock signal input terminal 2, an inverted clock signal CB, a normal clock signal C, a data input signal received at data input terminal 1, and an output signal provided at data output terminal 3. A data input signal may be provided to the data output terminal 3 by turning on (opening) a transfer gate in response to the rising edge of a clock signal received at clock signal input terminal 2.

First, transfer gate 6 may turn on at the rising edge of a clock signal received at clock signal input terminal 2. Then, after a gate delay T1 of inverter 14, inverted clock signal CB begins to fall. Transfer gate 4 may turn on at the falling edge of inverted clock signal CB. Then, after an additional gate delay T2 of inverter 15, normal clock signal C begins to rise. Transfer gate 5 may turn on at the rising edge of normal clock signal C. Because transfer gate 6 may be turned on at the same time a clock signal at clock signal input terminal 2 rises, data transfer speed may be improved.

Because a control terminal of transfer gate 6 may be connected directly to a clock signal input terminal 2, transfer gate 6 may be turned on at the rising edge of a received clock signal. In this way, a delay time from a rising edge of the clock signal received at clock signal input terminal 2 to the data output at data output terminal 3 may be decreased. Thus, high-speed operation may be improved.

Also, because normal clock signal C may be generated by buffering a clock signal received at clock signal input terminal 2 with inverters (14 and 15), normal clock signal C may be a more ideal waveform and may have sharper edges. Thus, if a clock signal received at clock signal input terminal 2 has a rounded waveform due to wiring or load capacitance or the like, transfer gate 5 may be controlled by normal clock signal C, which may have a fast rise time. In this way, a delay caused by rounding of a received clock signal waveform may be prevented and high-speed operation may be improved.

Figure 4:
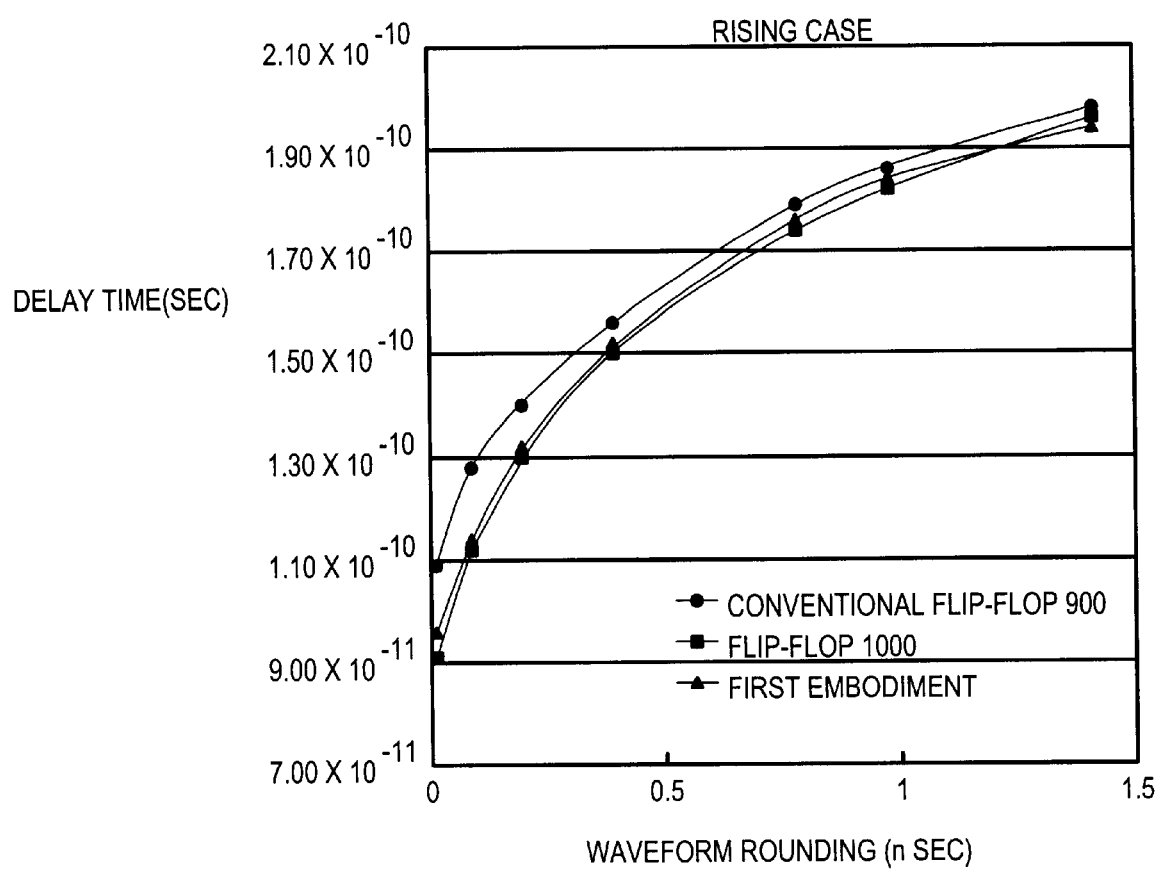
FIG. 4 is a graph illustrating a relationship between rounding of rising edge of a clock signal waveform and a delay time of data switching from a high to a low logic level at an output of transfer gates.
Figure 5:
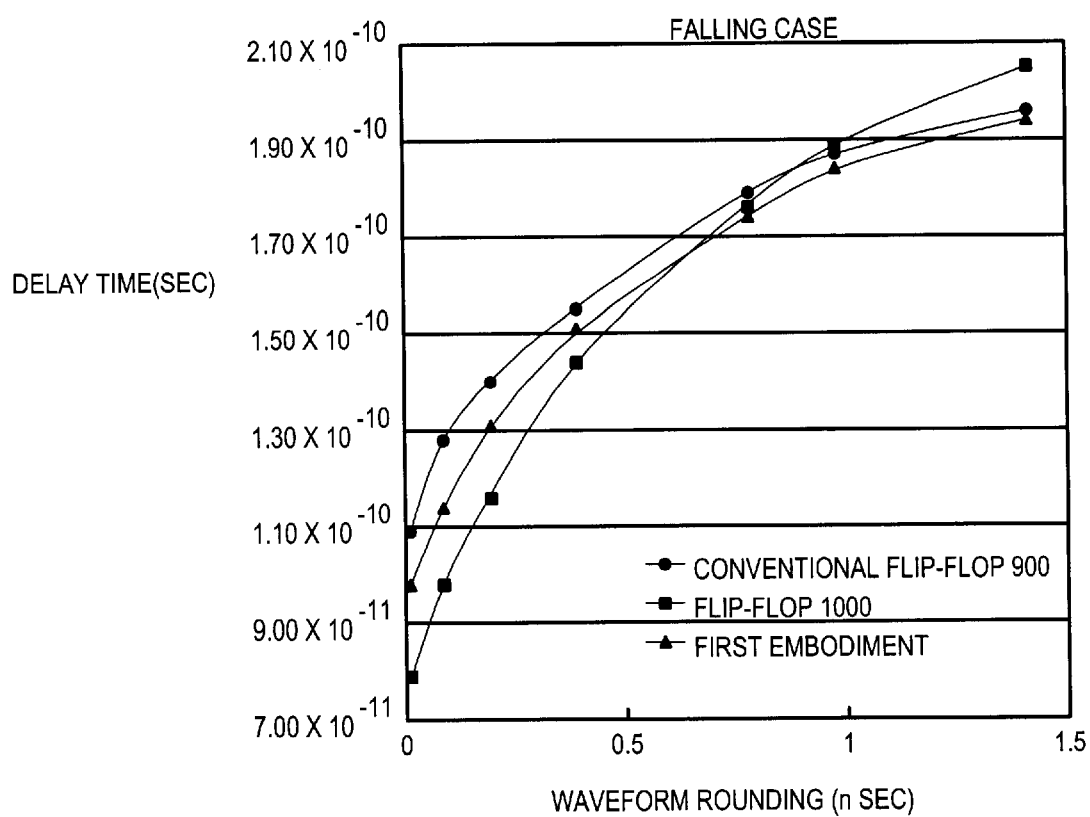
FIG. 5 is a graph illustrating a relationship between rounding of a rising edge of a clock signal waveform and a delay time of data switching from a high to a low logic level at an output of transfer gates.

The affect of the rounding of the clock signal waveform is illustrated in FIGS. 4 and 5. FIG. 4 is a graph illustrating a relationship between rounding of rising edge of a clock signal waveform and a delay time of data switching from a high to a low logic level at an output of transfer gates. FIG. 5 is a graph illustrating a relationship between rounding of a rising edge of a clock signal waveform and a delay time of data switching from a high to a low logic level at an output of transfer gates.

FIGS. 4 and 5 illustrate a relationship between rounding of an edge of a clock signal waveform and a delay time for conventional flip-flop circuit 900, flip-flop circuit 1000, and flip-flop circuit 100 (first embodiment).

In flip-flop circuit 100 (first embodiment), the delay time is smaller than the delay time in conventional flip-flop 900 regardless as to the amount of rounding of an edge of a clock signal waveform for both the a case where a data signal goes from a logic high level to a logic low level (FIG. 5) and a case where a data signal goes from a logic low level to a logic high level (FIG. 4).

However, in the case of a data signal switching from a logic high level to a logic low level (FIG. 5), flip-flop circuit 1000 has a delay that greatly increases as the rounding of the rising edge of a clock signal waveform becomes larger. However, in flip-flop circuit 100 (first embodiment), the delay may stay relatively small as the rounding of the rising edge of a clock signal waveform becomes larger. As illustrated in FIG. 5, when rounding of a rising edge of a clock waveform exceeds about 0.75 nsec, the delay in flip-flop circuit 100 (first embodiment) may be smaller than the delay in flip-flop circuit 1000.

Figure 6:
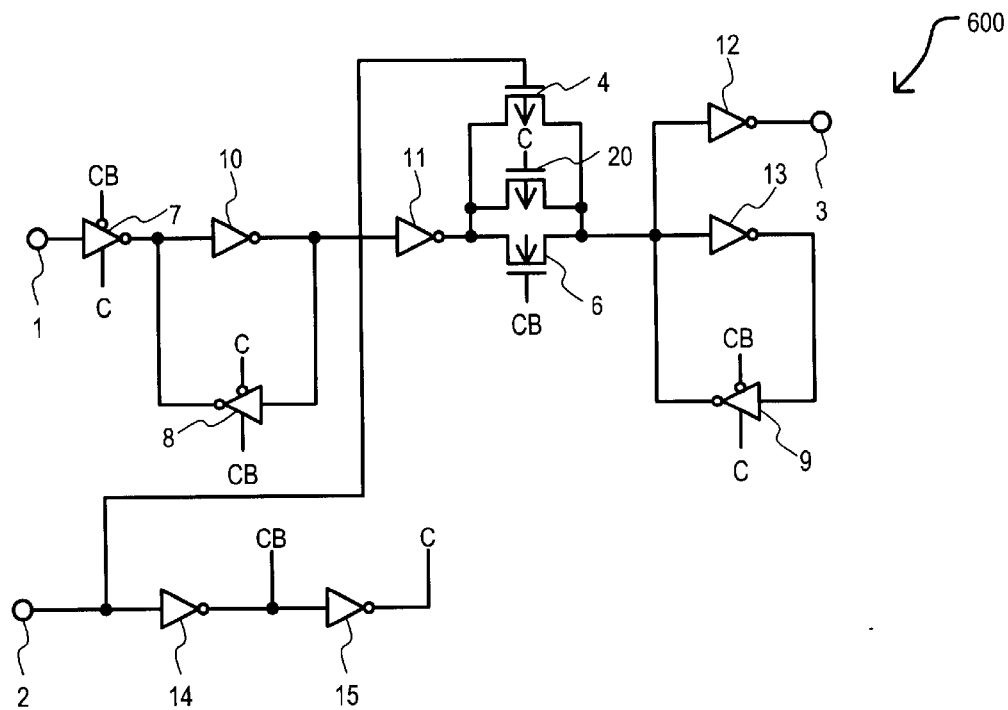
FIG. 6 is a circuit schematic diagram of flip-flop circuit according to an embodiment.

Referring now to FIG. 6, a circuit schematic diagram of flip-flop circuit according to an embodiment is set forth and given the general reference character 600. Flip-flop circuit 600 may be a master-slave type flip-flop, as just one example. Flip-flop circuit 600 may include similar constituents as flip-flop circuit 100. Such constituents may be referred to by the same reference character and a detailed description may be omitted.

Flip-flop circuit 600 may include a transfer gate 20 instead of a transfer gate 5 as in flip-flop circuit 100. Transfer gate 20 may be an insulated gate field effect transistor (IGFET) and more particularly may be a p-type metal oxide semiconductor field effect transistor (MOSFET), as just one example. Transfer gates (4, 20, and 6) may each have a source/drain commonly connected to an output of inverter 11 and another source/drain commonly connected to an input of inverter 12 and an input of inverter 13. Transfer gate 4 may have a control terminal connected to clock signal input terminal 2. Transfer gate 20 may receive normal clock signal C at a control terminal. Transfer gate 6 may receive inverted clock signal CB at a control terminal.

Clocked inverter 7 may receive inverted clock signal CB at an inverted enable terminal and normal clock signal C at an enable terminal. Clocked inverter 8 may receive normal clock signal C at an inverted enable terminal and inverted clock signal CB at an enable terminal. Clocked inverter 9 may receive inverted clock signal CB at an inverted enable terminal and normal clock signal C at an enable terminal.

Flip-flop circuit 600 may receive a data input signal at a data input terminal 1, a clock signal at a clock signal input terminal 2 and provide an output signal at a data output terminal 3. Flip-flop circuit 600 may provide data received at data input terminal 1 to data output terminal 3 in response to a falling edge of a clock signal received at clock signal input terminal 2.

Inverter 10 and clocked inverter 8 may form a master flip-flop or latch. The master flip-flop or latch may be enabled in response to a falling edge of a clock signal provided at clock signal input terminal 2. In this way, data provided at data input terminal 1 at the falling edge of the clock signal may be held in the master flip-flop or latch.

Inverter 13 and clocked inverter 9 may form a slave flip-flop or latch. The slave flip-flop or latch may be enabled in response to a rising edge of a clock signal provided at clock signal input terminal 2. In this way, data stored in the master flip-flop or latch at the rising edge of the clock signal may be held in the slave flip-flop or latch.

Transfer gates (4, 20, and 6) may be turned on in response to a falling edge of a clock signal provided at clock signal input terminal 2 and may be turned off in response to a rising edge of a clock signal provided at clock signal input terminal 2.

In this way, data held in the master latch (master flip-flop) may be transferred to the input of inverter 12 through transfer gates (4, 20, and 6) in response to the falling edge of a clock signal provided at clock signal input terminal 2. This data may then be output to data output terminal 3 by inverter 12. Transfer gates (4, 20, and 6) may then be turned off in response to a rising edge of a clock signal provided at clock signal input terminal 2. At this time, the data may be held in the slave latch (slave flip-flop).

In flip-flop circuit 600, the gate width of transfer gate 4 may be set to be equal to or smaller than the gate width of transfer gate 20. Other sizes may be essentially the same as in flip-flop circuit 100.

In flip-flop circuit 600, because transfer gate 4 may open essentially at the falling edge timing of a clock signal received at clock signal input terminal 2, high-speed operations may be improved.

Also, because normal clock signal C may be generated by buffering a clock signal received at clock signal input terminal 2 with inverters (14 and 15), normal clock signal C may be a more ideal waveform and may have sharper edges. Thus, if a clock signal received at clock signal input terminal 2 has a rounded waveform due to wiring or load capacitance or the like, transfer gate 20 may be controlled by normal clock signal C, which may have a fast fall time. In this way, a delay caused by rounding of a received clock waveform may be prevented and high-speed operation may be improved.

Figure 7:
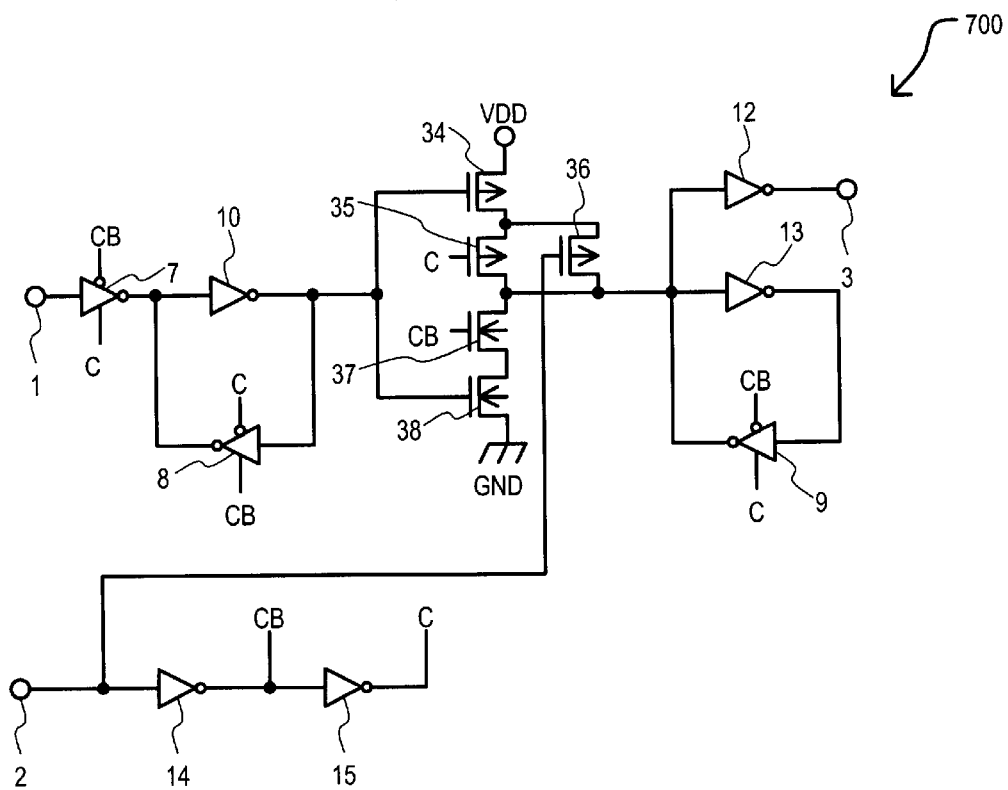
FIG. 7 is a circuit schematic diagram of flip-flop circuit according to an embodiment.

Referring now to FIG. 7, a circuit schematic diagram of flip-flop circuit according to an embodiment is set forth and given the general reference character 700. Flip-flop circuit 700 may be a master-slave type flip-flop, as just one example. Flip-flop circuit 700 may include similar constituents as flip-flop circuit 100. Such constituents may be referred to by the same reference character and a detailed description may be omitted.

Flip-flop circuit 700 may include a clocked inverter including transistors (34 to 38) instead of transfer gates (4, 5, and 6) and inverter 11 as in flip-flop circuit 100. Transistor 34 may have a source connected to a power supply VDD, a drain commonly connected to sources of transistors (35 and 36) and a control gate connected to receive an output of inverter 10. Transistor 35 may have a drain commonly connected to drains of transistors (36 and 37) and an input to inverters (12 and 13) and a control gate connected to receive normal clock signal C. Transistor 36 may have a control gate connected to clock signal input terminal 2. Transistor 37 may have a source connected to a drain of transistor 38 and a control gate connected to receive inverted clock signal CB. Transistor 38 may have a source connected to ground GND and a gate connected to receive an output of inverter 10.

Transistors (34, 35, and 36) may be IGFETs and more particularly may be a p-type MOSFETs, as just one example. Transistors (37 and 38) may be IGFETs and more particularly may be a n-type MOSFETs, as just one example.

Clocked inverter 7 may receive inverted clock signal CB at an inverted enable terminal and normal clock signal C at an enable terminal. Clocked inverter 8 may receive normal clock signal C at an inverted enable terminal and inverted clock signal CB at an enable terminal. Clocked inverter 9 may receive inverted clock signal CB at an inverted enable terminal and normal clock signal C at an enable terminal.

Flip-flop circuit 700 may receive a data input signal at a data input terminal 1, a clock signal at a clock signal input terminal 2 and provide an output signal at a data output terminal 3. Flip-flop circuit 700 may provide data received at data input terminal 1 to data output terminal 3 in response to a falling edge of a clock signal received at clock signal input terminal 2.

Inverter 10 and clocked inverter 8 may form a master flip-flop or latch. The master flip-flop or latch may be enabled in response to a falling edge of a clock signal provided at clock signal input terminal 2. In this way, data provided at data input terminal 1 at the falling edge of the clock signal may be held in the master flip-flop or latch.

Inverter 13 and clocked inverter 9 may form a slave flip-flop or latch. The slave flip-flop or latch may be enabled in response to a rising edge of a clock signal provided at clock signal input terminal 2. In this way, data stored in the master flip-flop or latch at the rising edge of the clock signal may be held in the slave flip-flop or latch.

Clocked inverter formed by transistors (34 to 36) may be enabled in response to a falling edge of a clock signal provided at clock signal input terminal 2 and may be disabled (placed in a high-impedance state, for example) in response to a rising edge of a clock signal provided at clock signal input terminal 2.

In this way, data held in the master latch (master flip-flop) may be transferred to the input of inverter 12 through clocked inverter formed by transistors (34 to 36) in response to the falling edge of a clock signal provided at clock signal input terminal 2. This data may then be output to data output terminal 3 by inverter 12. Clocked inverter formed by transistors (34 to 36) may then be disabled in response to a rising edge of a clock signal provided at clock signal input terminal 2. At this time, the data may be held in the slave latch (slave flip-flop).

In flip-flop circuit 700, transistors (35 and 36) may be connected in parallel. Because transistor 36 may be turned on essentially at the falling edge timing of a clock signal received at clock signal input terminal 2, high-speed operations may be improved. Also, because normal clock signal C may be generated by buffering a clock signal received at clock signal input terminal 2 with inverters (14 and 15), normal clock signal C may be a more ideal waveform and may have sharper edges. Thus, if a clock signal received at clock signal input terminal 2 has a rounded waveform due to wiring or load capacitance or the like, transistor 35 may be controlled by normal clock signal C, which may have a fast fall time. In this way, a delay caused by rounding of a received clock signal waveform may be prevented and high-speed operation may be improved.

Figure 8:
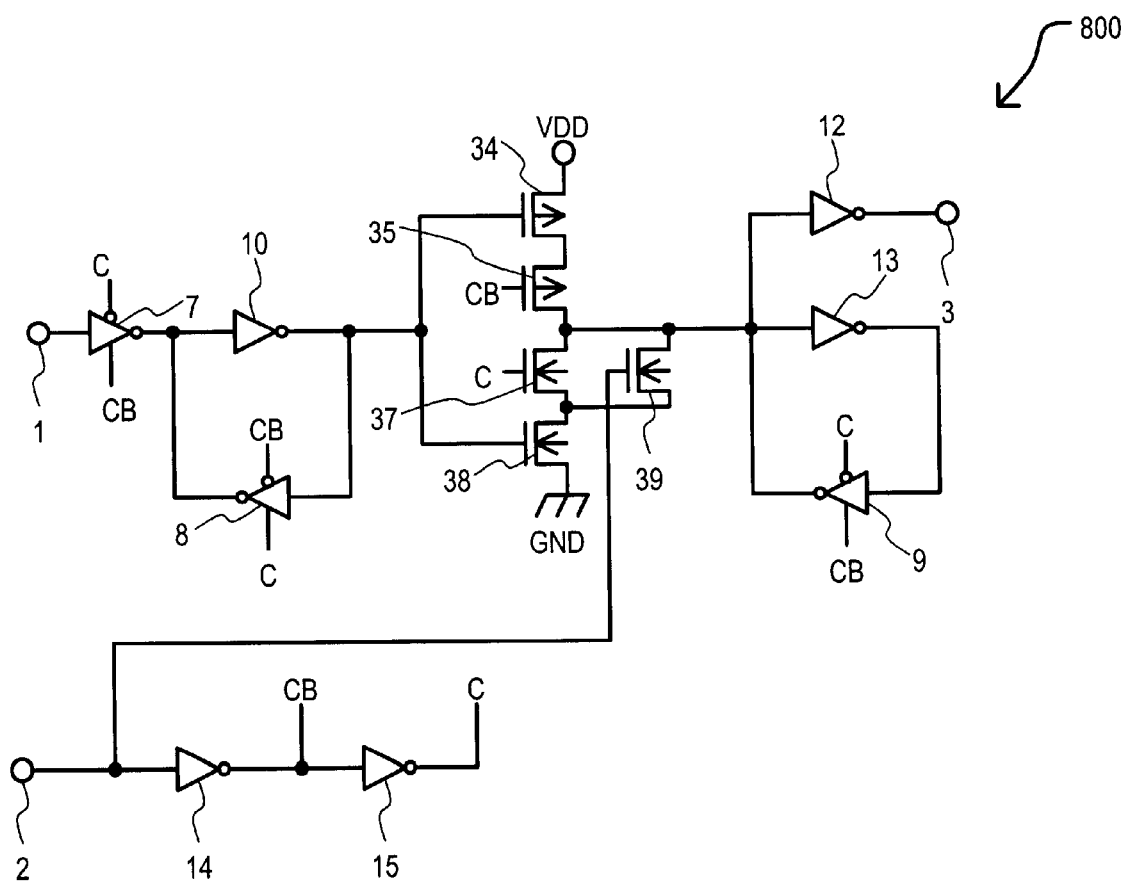
FIG. 8 is a circuit schematic diagram of flip-flop circuit according to an embodiment.
Figure 9:
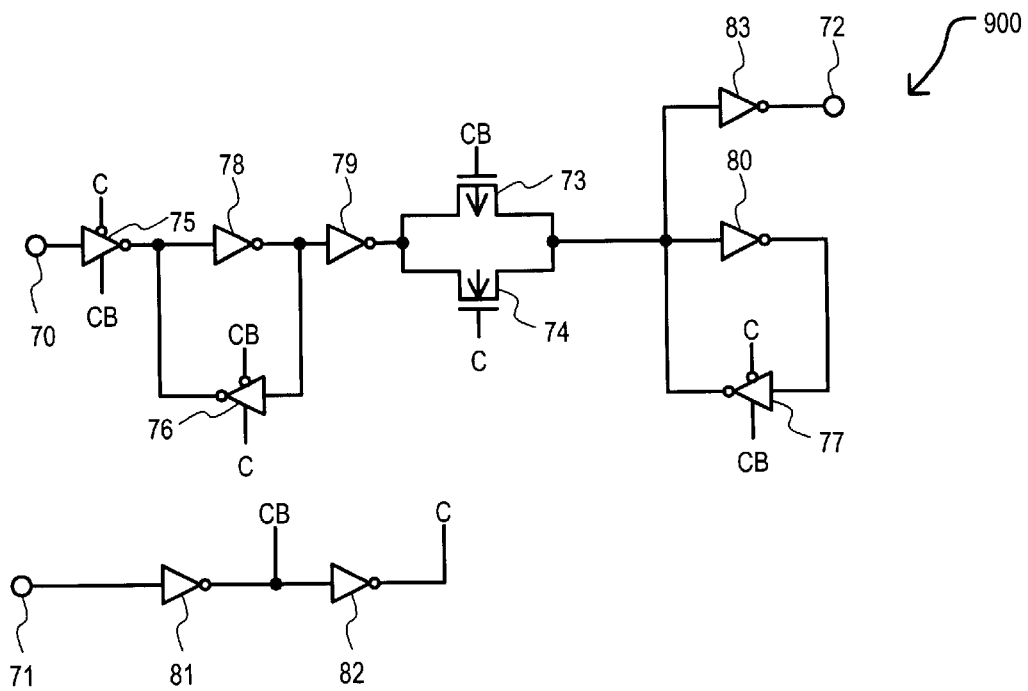
FIG. 9 is a circuit schematic diagram of a conventional flip-flop circuit.
Figure 10:
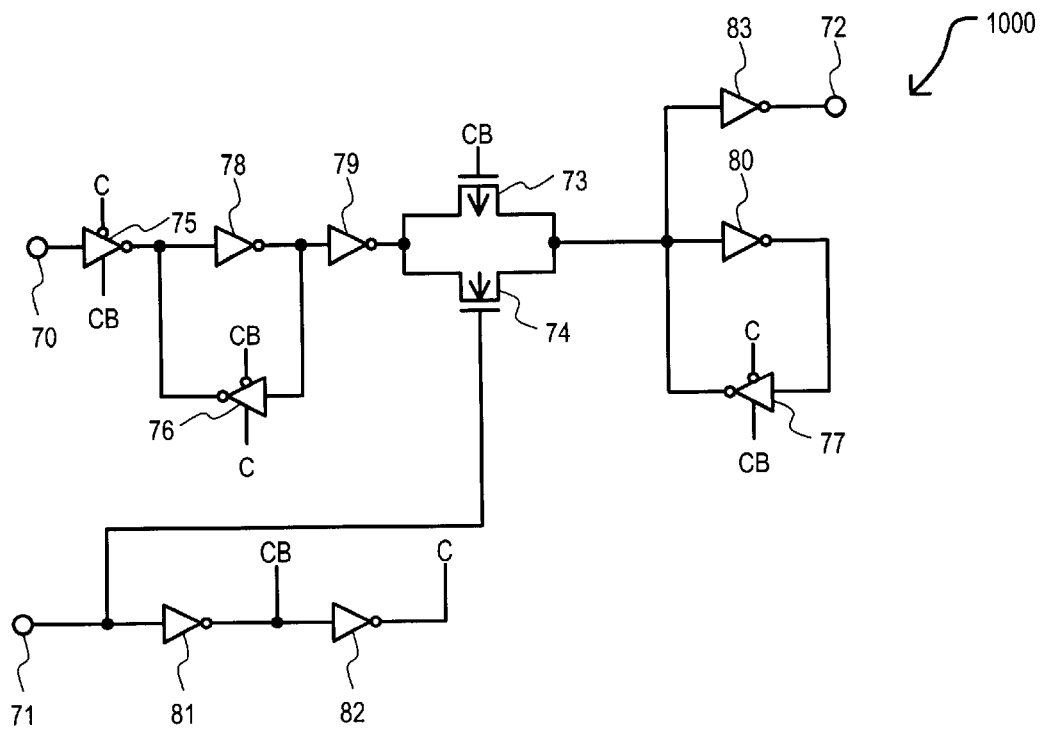
FIG. 10 is a circuit schematic diagram of a flip-flop circuit proposed to improve the operating speeds of the conventional flip-flop circuit of FIG. 9.

Referring now to FIG. 8, a circuit schematic diagram of flip-flop circuit according to an embodiment is set forth and given the general reference character 800. Flip-flop circuit 800 may be a master-slave type flip-flop, as just one example. Flip-flop circuit 800 may include similar constituents as flip-flop circuit 700. Such constituents may be referred to by the same reference character and a detailed description may be omitted.

Flip-flop circuit 700 may include a clocked inverter including transistors (34, 35, 37, 38, and 39). Transistor 34 may have a source connected to a power supply VDD, a drain commonly connected to sources of transistor 35 and a control gate connected to receive an output of inverter 10. Transistor 35 may have a drain commonly connected to drains of transistors (37 and 39) and an input to inverters (12 and 13) and a control gate connected to receive inverted clock signal CB. Transistor 37 may have a source commonly connected to a drain of transistor 38 and a source of transistor 39 and a control gate connected to receive normal clock signal CB. Transistor 39 may have a gate connected to clock signal input terminal 2. Transistor 38 may have a source connected to ground GND and a gate connected to receive an output of inverter 10.

Transistors (34 and 35) may be IGFETs and more particularly may be a p-type MOSFETs, as just one example. Transistors (37, 38 and 39) may be IGFETs and more particularly may be a n-type MOSFETs, as just one example.

Clocked inverter 7 may receive inverted clock signal CB at an enable terminal and normal clock signal C at an inverted enable terminal. Clocked inverter 8 may receive normal clock signal C at an enable terminal and inverted clock signal CB at an inverted enable terminal. Clocked inverter 9 may receive inverted clock signal CB at an enable terminal and normal clock signal C at an inverted enable terminal.

Flip-flop circuit 800 may receive a data input signal at a data input terminal 1, a clock signal at a clock signal input terminal 2 and provide an output signal at a data output terminal 3. Flip-flop circuit 800 may provide data received at data input terminal 1 to data output terminal 3 in response to a rising edge of a clock signal received at clock signal input terminal 2.

Inverter 10 and clocked inverter 8 may form a master flip-flop or latch. The master flip-flop or latch may be enabled in response to a rising edge of a clock signal provided at clock signal input terminal 2. In this way, data provided at data input terminal 1 at the rising edge of the clock signal may be held in the master flip-flop or latch.

Inverter 13 and clocked inverter 9 may form a slave flip-flop or latch. The slave flip-flop or latch may be enabled in response to a falling edge of a clock signal provided at clock signal input terminal 2. In this way, data stored in the master flip-flop or latch at the falling edge of the clock signal may be held in the slave flip-flop or latch.

Clocked inverter formed by transistors (34, 35, 37, 38, and 39) may be enabled in response to a rising edge of a clock signal provided at clock signal input terminal 2 and may be disabled (placed in a high-impedance state, for example) in response to a falling edge of a clock signal provided at clock signal input terminal 2.

In this way, data held in the master latch (master flip-flop) may be transferred to the input of inverter 12 through clocked inverter formed by transistors (34, 35, 37, 38, and 39) in response to the rising edge of a clock signal provided at clock signal input terminal 2. This data may then be output to data output terminal 3 by inverter 12. Clocked inverter formed by transistors (34, 35, 37, 38, and 39) may then be disabled in response to a falling edge of a clock signal provided at clock signal input terminal 2. At this time, the data may be held in the slave latch (slave flip-flop).

In flip-flop circuit 800, transistors (37 and 39) may be connected in parallel. Because transistor 39 may be turned on essentially at the rising edge timing of a clock signal received at clock signal input terminal 2, high-speed operations may be improved. Also, because normal clock signal C may be generated by buffering a clock signal received at clock signal input terminal 2 with inverters (14 and 15), normal clock signal C may be a more ideal waveform and may have sharper edges. Thus, if a clock signal received at clock signal input terminal 2 has a rounded waveform due to wiring or load capacitance or the like, transistor 37 may be controlled by normal clock signal C, which may have a fast fall time. In this way, a delay caused by rounding of a received clock signal waveform may be prevented and high-speed operation may be improved.

According to the embodiments, a clock input signal may be connected directly to a control terminal of a transfer circuit, such as a transfer gate or the like. In this way, a delay period from an edge of a clock signal to the output of data may be reduced and high-speed operations may be improved.

Also, because another transfer circuit, such as a transfer gate or the like may be connected in parallel and controlled by a buffered clock signal having a more ideal waveform, even if waveform rounding or distortion occurs in a clock input signal due to wiring capacitance or the like, high-speed operations may be maintained.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A flip-flop circuit, comprising:
   a master flip-flop coupled to receive a data input;
   a slave flip-flop coupled to provide a data output;
   a first inverter coupled to receive a clock signal and providing an inverted clock signal;
   a second inverter coupled to receive the inverted clock signal and providing a normal clock signal; and
   a data transfer circuit that provides a data path between the master flip-flop and the slave flip-flop,
   the data transfer circuit includes
      a first transfer gate of a first conductivity type providing a first controllable impedance path between the master flip-flop and the slave flip-flop and having a first control terminal connected to receive the clock signal;

a second transfer gate of the first conductivity type providing a second controllable impedance path in parallel with the first controllable impedance path and having a second control terminal coupled to receive the normal clock signal; and a third transfer gate of a second conductivity type providing a third controllable impedance path in parallel with the first controllable impedance path and having a third control terminal coupled to receive the inverted clock signal.

2. The flip-flop circuit according to claim 1, wherein:

the first conductivity type is a n-type and the second conductivity type is a p-type; and the first, second, and third transfer gates are insulated gate field effect transistors (IGFETs).

3. The flip-flop circuit according to claim 1, wherein:

the master flip-flop includes a first master flip-flop inverter and a second master flip-flop inverter arranged to form a flip-flop; and the slave flip-flop includes a first slave flip-flop inverter and a second slave flip-flop inverter arranged to form a flip-flop.

4. The flip-flop circuit according to claim 3, wherein:

the second master flip-flop inverter and the second slave flip-flop inverter are clocked inverters.

5. The flip-flop circuit according to claim 1, wherein:

the first conductivity type is a p-type and the second conductivity type is a n-type; and the first, second, and third transfer gates are insulated gate field effect transistors (IGFETs).

6. The flip-flop circuit according to claim 1, wherein:

the first, second, and third transfer gates are insulated gate field effect transistors (IGFETs); and the first transfer gate has a gate width that is less than or equal to a gate width of the second transfer gate.

7. A flip-flop circuit, comprising:

a master flip-flop coupled to receive a data input;

a slave flip-flop coupled to provide a data output;

a first inverter coupled to receive a clock signal and providing an inverted clock signal;

a second inverter coupled to receive the inverted clock signal and providing a normal clock signal; and a data transfer circuit that provides a data path between the master flip-flop and an input of the slave flip-flop, the data transfer circuit includes a first transfer gate of a first conductivity type providing a first controllable impedance path between a first reference potential and an input of the slave flip-flop and having a first control terminal connected to receive the clock signal;

a second transfer gate of the first conductivity type providing a second controllable impedance path in parallel with the first controllable impedance path and having a second control terminal coupled to receive the normal clock signal; and a third transfer gate of a second conductivity type providing a third controllable impedance path between a second reference potential and the input of the slave flip-flop and having a third control terminal coupled to receive the inverted clock signal.

8. The flip-flop according to claim 7, wherein:

the first conductivity type is a n-type and the second conductivity type is a p-type;

the first, second, and third transfer gates are insulated gate field effect transistors (IGFETs); and the first reference potential is a lower than the second reference potential.

9. The flip-flop according to claim 8, wherein:

the data transfer circuit further includes a fourth transfer gate of the first conductivity type and a fifth transfer gate of the second conductivity type coupled to receive an output from the master flip-flop at control terminals and providing a logical inversion when the first, second, and third transfer gates are enabled.

10. The flip-flop circuit according to claim 7, wherein:

the first conductivity type is a p-type and the second conductivity type is a n-type;

the first, second, and third transfer gates are insulated gate field effect transistors (IGFETs); and the first reference potential is a higher than the second reference potential.

11. The flip-flop circuit according to claim 10, wherein:

the data transfer circuit further includes a fourth transfer gate of the first conductivity type and a fifth transfer gate of the second conductivity type coupled to receive an output from the master-flip flop at control terminals and providing a logical inversion when the first, second, and third transfer gates are enabled.

12. The flip-flop circuit according to claim 7, wherein:

the master flip-flop includes a first master flip-flop inverter and a second master flip-flop inverter arranged to form a flip-flop; and the slave flip-flop includes a first slave flip-flop inverter and a second slave flip-flop inverter arranged to form a flip-flop.

13. The flip-flop circuit according to claim 12, wherein:

the second master flip-flop inverter and the second slave flip-flop inverter are clocked inverters.

14. A flip-flop circuit, comprising:

a first inverter coupled to receive a clock signal and providing an inverted clock signal;

a second inverter coupled to receive the inverted clock signal and providing a normal clock signal;

a first data latch coupled to receive input data and latch an input data value in response to the clock signal having a first logic state;

a second data latch coupled to receive transfer data and latch a transfer data value in response to the clock signal having a second logic state; and a transfer circuit having a transfer circuit input coupled to receive the input data value and a transfer circuit output coupled to provide the transfer data in response to the clock signal having the first logic state, the transfer circuit includes a first transfer insulated gate field effect transistor (IGFET) of a first conductivity type having a first IGFET control terminal connected to receive the clock signal;

a second IGFET of the first conductivity type having a second IGFET control terminal coupled to receive the normal clock signal; and a third IGFET of a second conductivity type having a third IGFET control terminal coupled to receive the inverted clock signal.

15. The flip-flop circuit according to claim 14, wherein:

the first, second, and third IGFETs have controllable impedance paths connected in parallel between the transfer circuit input and the transfer circuit output.

16. The flip-flop circuit according to claim 15, wherein:

the first conductivity type is n-type and the second conductivity type is p-type.

17. The flip-flop circuit according to claim 15, wherein:

the first conductivity type is p-type and the second conductivity type is n-type.

18. The flip-flop circuit according to claim 14, wherein:

the first and second IGFETs have controllable impedance paths connected in parallel between a first potential and the transfer circuit output; and the third IGFET has a controllable impedance path connected between a second potential and the transfer circuit output.

19. The flip-flop circuit according to claim 18, wherein:

the first conductivity type is n-type and the second conductivity type is p-type; and the first potential is a ground potential and the second potential is a power supply potential.

20. The flip-flop circuit according to claim 18, wherein:

the first conductivity type is p-type and the second conductivity type is n-type; and the first potential is a power supply potential and the second potential is a ground potential.

* * * * *